United States Patent
Campbell et al.

(10) Patent No.: US 7,655,893 B2
(45) Date of Patent: *Feb. 2, 2010

(54) OPTIMIZATION OF ALIGNMENT BETWEEN ELEMENTS IN AN IMAGE SENSOR

(75) Inventors: Scott P. Campbell, Thousand Oaks, CA (US); Richard H. Tsai, Arcadia, CA (US); Gennadiy A. Agranov, Boise, ID (US); Eric R. Fossum, Wolfeboro, NH (US)

(73) Assignee: Aptina Imaging Corporation (KY)

( * ) Notice: Subject to any disclaimer, the term of this patent is extended or adjusted under 35 U.S.C. 154(b) by 7 days.

This patent is subject to a terminal disclaimer.

(21) Appl. No.: 12/068,517

(22) Filed: Feb. 7, 2008

(65) Prior Publication Data

US 2009/0045322 A1    Feb. 19, 2009

Related U.S. Application Data

(63) Continuation of application No. 10/703,426, filed on Nov. 10, 2003, now Pat. No. 7,351,945, which is a continuation-in-part of application No. 10/135,875, filed on Apr. 29, 2002, now abandoned.

(60) Provisional application No. 60/286,908, filed on Apr. 27, 2001.

(51) Int. Cl.
    *H01L 27/00* (2006.01)

(52) U.S. Cl. .................. 250/208.1; 250/216; 257/432; 257/E27.133

(58) Field of Classification Search .............. 250/208.1, 250/216, 239; 257/294, 432, 440, E27.133, 257/E27.134; 348/264, 265, 272, 294, 340; 359/619, 622

See application file for complete search history.

(56) References Cited

U.S. PATENT DOCUMENTS

| | | |
|---|---|---|
| 5,610,390 A | 3/1997 | Miyano |
| 6,008,511 A | 12/1999 | Tokumitsu et al. |
| 6,344,666 B1 | 2/2002 | Yamaguchi et al. |
| 6,518,640 B2 | 2/2003 | Suzuki et al. |
| 6,573,935 B1 | 6/2003 | Yamada |
| 7,351,945 B2 * | 4/2008 | Campbell et al. ........ 250/208.1 |
| 2001/0026322 A1 | 10/2001 | Takahashi et al. |

OTHER PUBLICATIONS

G. Agranov et al., "Crosstalk and Microlens Study in a Color CMOS Image Sensor," IEEE Transactions on Electron Devices, vol. 50, No. 1, Jan. 2003, pp. 4-11.

* cited by examiner

*Primary Examiner*—Kevin Pyo
(74) *Attorney, Agent, or Firm*—Dickstein Shapiro LLP (57) ABSTRACT

An image sensor is formed with shifts among the optical parts of the sensor and the photosensitive parts of the sensor. The optical parts of the sensor may include a color filter array and/or microlenses. The photosensitive part may include any photoreceptors such as a CMOS image sensor. The shifts allow images to be formed even when the light received at a given pixel location varies in angle of incidence as a function of pixel location within the array. The relative shifts among the pixel components may be, for example, plus or minus some fraction of the pixel pitch. The shift may be variable across the array or may be constant across the array and may be deterministically determined.

5 Claims, 8 Drawing Sheets

OPTIMIZATION OF ALIGNMENT BETWEEN ELEMENTS IN AN IMAGE SENSOR

CROSS-REFERENCE TO RELATED APPLICATIONS

The present application claims priority from provisional application No. 60/286,908, filed Apr. 27, 2001. The present application is a continuation of U.S. patent application Ser. No. 10/703,426, filed on Nov. 10, 2003, now U.S. Pat. No. 7,351,945 which is a continuation-in-part of application Ser. No. 10/135,875 filed on Apr. 29, 2002, now abandoned which are hereby incorporated by reference in their entirety.

BACKGROUND

Image sensors receive light into an array of photosensitive pixels. Each pixel may be formed of a number of cooperating elements including, for example, a lens, often called a "microlens.", a color filter which blocks all but one color from reaching the photosensitive portion, and the photosensitive portion itself. These elements are typically formed on different physical levels of a substrate.

It has typically been considered that the elements of the pixels should have their centers substantially exactly aligned. That is, the microlens, the color filter, and the photosensitive portion should each be substantially coaxial. The physical process used to create the semiconductor will have inherent errors, however, conventional wisdom attempts to minimize these errors.

SUMMARY

The present application teaches a way to improve image acquisition through intentional shift among different optical parts of the optical elements in the array. This may be done to compensate for various characteristics related to acquisition of the image.

In an embodiment, the amount of shift may be variable throughout the array, to compensate for imaging lens angles. That is, the amount of shift at one location in the array may be different than the amount of shift at other locations in the array. Such a variable relative shift may also be used to obtain a three-dimensional view.

BRIEF DESCRIPTION OF THE DRAWINGS

These and other aspects will now be described in detail with reference to the accompanying drawings, wherein.

DETAILED DESCRIPTION

In the following detailed description, reference is made to the accompanying drawings, which form a part hereof, and in which is shown by way of illustration specific embodiments in which the invention may be practiced. These embodiments are described in sufficient detail to enable those of ordinary skill in the art to make and use the invention, and it is to be understood that structural, logical or procedural changes may be made to the specific embodiments disclosed without departing from the spirit and scope of the present invention.

The present application teaches a photosensor with associated parts, including passive imaging parts, such as a lens and/or color filter, and photosensitive parts. An alignment among the imaging parts and the photosensitive parts is described.

The imaging parts may include at least one of a microlens and/or a filter from a color filter array. The photosensitive parts may include any photosensitive element, such as a photodiode, photogate, or other photosensitive part.

Figure 1:
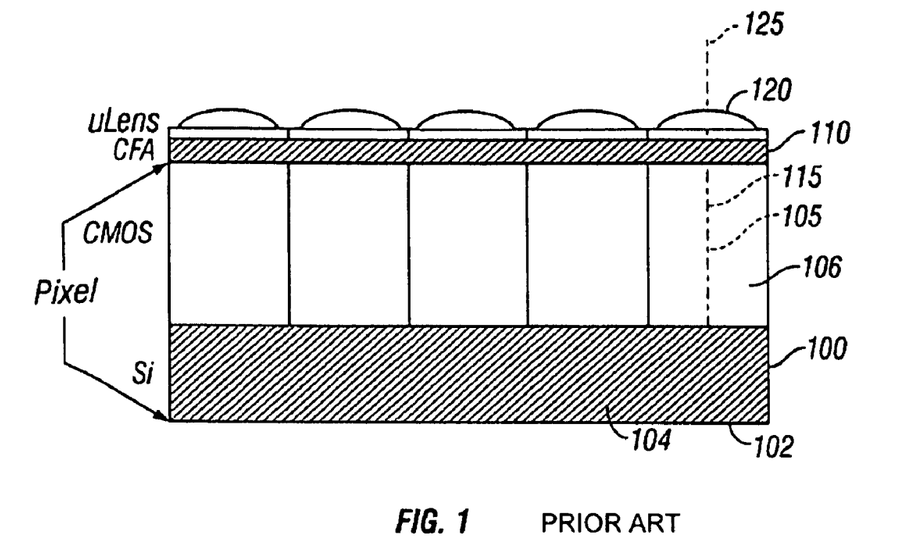
FIG. 1 shows a layout of optical parts including microlens and color filter array which is aligned directly with its underlying photosensitive part.

FIG. 1 shows a typical array used in an image sensor that is arranged into pixels, such as a CMOS image sensor array. The image sensor array 100 is divided into a number of different pixel areas 102,104. Each different pixel area may include a photosensor 106 therein, for example a photodiode or the like. The photosensor 106 is preferably a CMOS type photosensor such as the type described in U.S. Pat. No. 5,471,515. Each pixel such as pixel 102 also appends a color filter 110 in a specified color. The color filters 110 collectively form a color filter array. Each pixel may also append an associated microlens 120. In FIG. 1, the center axis 125 of the microlens 120 substantially aligns with the center axis 115 of the color filter 110 which also substantially aligns with the center axis 105 of the CMOS photosensor 106.

Figure 2:
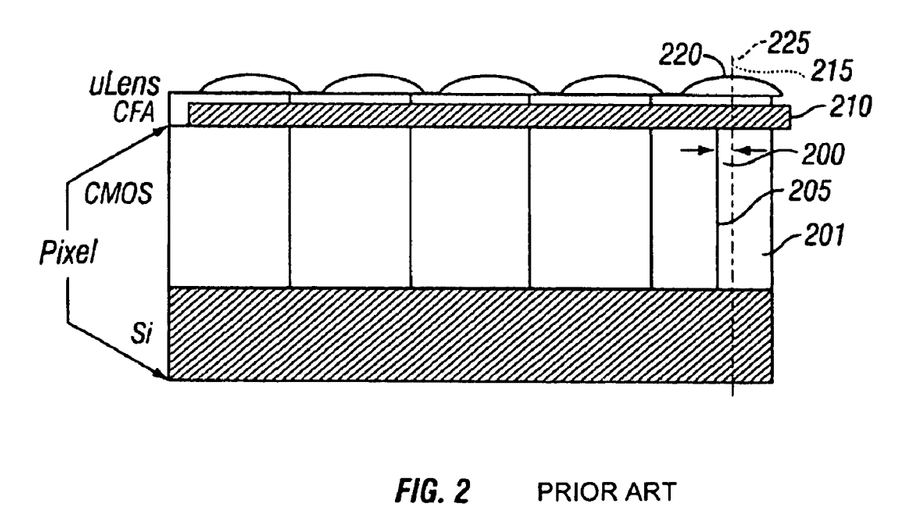
FIG. 2 shows a layout of optical parts with a shift among the centers of the microlens/filter array and the photosensitive part.

FIG. 2 shows an alternative embodiment in which the centers of the elements are shifted relative to one another. In the FIG. 2 embodiment, the center line 225 of the lens 220 may be substantially aligned with the center line 215 of the color filter 210. However, this center line 215/225 may be offset by an amount 200 from the line 205 of the photosensor 201 which represents the point of maximum photosensitivity of the photosensor 201. Line 205 may be the center of the photosensor 201. That is, the filters 210 and microlenses 220 have shifted centers relative to the line 205 of the photoreceptor/photosensor 201. According to an embodiment, the amount of shift is controlled to effect the way the light is received into the photosensitive part of the pixels.

The shift among the pixels may be configured to minimize the crosstalk among neighboring pixels. This crosstalk may be spatial crosstalk among the neighboring pixels and spectral crosstalk within the pixel. In addition, the shift may be used to compensate for irregular beam angles during imaging, for example due to non telecentric imaging.

Relative shift among the microlenses and filter, and the photosensitive pixel centers, can vary across the array. According to an embodiment, the variable shift among the microlens/filter and pixel can be modeled according to the following equation:

$$S = D\tan\left\{\sin^{-1}\left[\frac{\sin(\theta)}{n}\right]\right\}$$
$$= D\tan\left\{\sin^{-1}\left[\frac{\sin\left(\frac{Mr}{R}\right)}{n}\right]\right\}$$

Where S is the variable shift among the center of the microlens and/or filters and the center of peak photosensitivity or minimum crosstalk region of the pixel, shown as 200 in FIG. 2. This center line, shown as 205 in FIG. 2, may be variable as a function of beam entry angles. D represents the physical distance between the plane of the microlens/filters and the plane of the peak photosensitive region of the pixels. The variable $\theta$ represents the external beam entry angle, and n is the refractive index of the medium between the microlens/filter and the photosensitive region of the pixel.

The beam entry angle $\theta$ can be replaced by the quotient Mr/R for general calculations, where M is the maximum beam angle of non-telecentricity, i.e. the maximum beam entry angle given at the maximum image point radius. The variable r is the image point radius under consideration for calculating S. R is the maximum image point radius.

Figure 3:
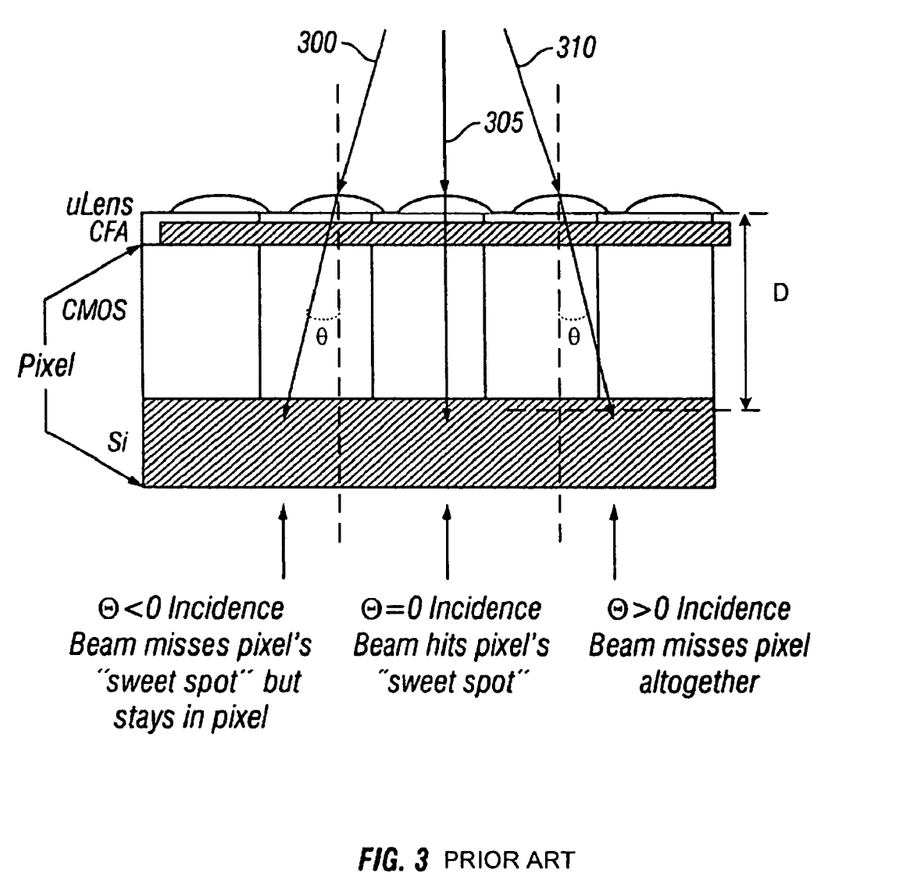
FIG. 3 shows the effect of varying angles of incidence with shifts among microlens and image sensor.

When the alignment among the optical elements is nonzero (S≠0), the misalignment may cause crosstalk among neighboring pixels, and may cause beams to arrive from irregular angles in the image plane. This may be especially problematic when non telecentric lenses are used for imaging. FIG. 3 shows how light at different angles of incidences will strike the pixel bases at different locations. Beams which are incident at angles<0, such as beam 300, strike the base of the pixel near, but not at, the pixel's peak photosensitive region. That is, the beam remains in the pixel, but misses the specific "sweet spot" of maximum photosensitivity.

The beams which are incident at angles equal to zero, such as beam 305, hit exactly on the pixel's "sweet spot" that is the area of maximum photosensitivity. Beams which are incident at other angles, such as beam 310, may, however, strike the base of the neighboring pixel. This forms spatial crosstalk.

Figure 4:
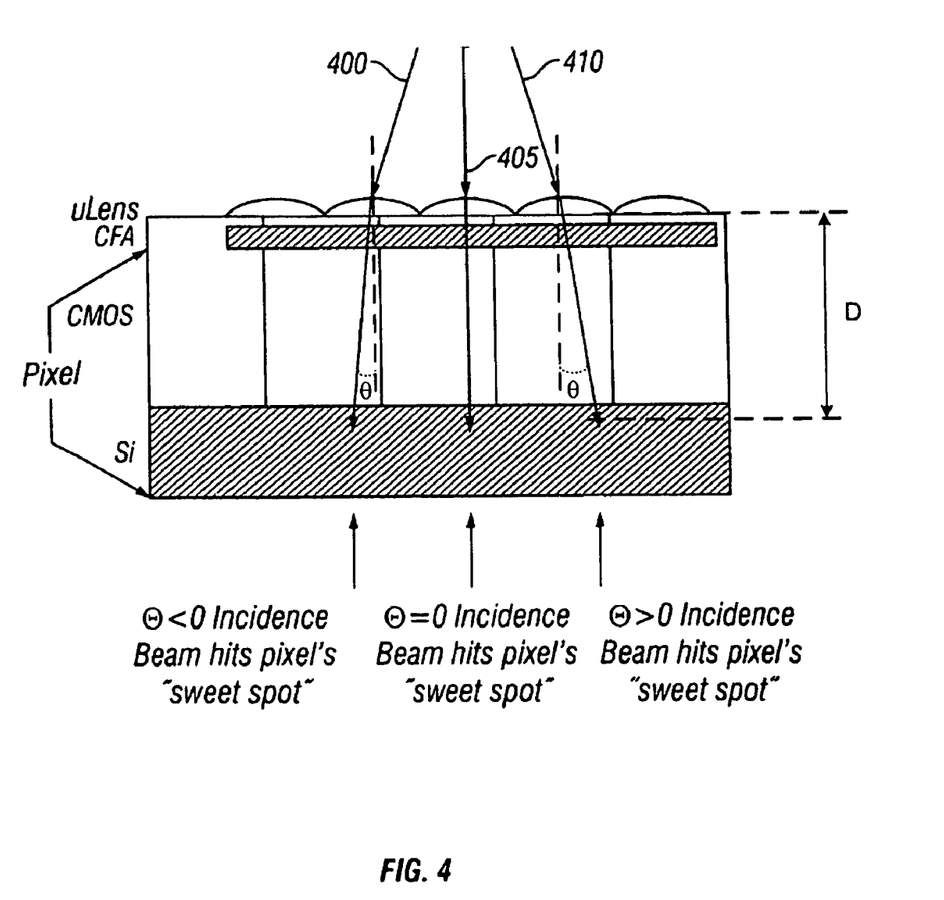
FIG. 4 shows an improved technique where shifts among optical part and photosensitive part are configured to maintain the light incident to the proper photosensitive element.

FIG. 4 shows the specific layout, with shifted pixel parts, which is used according to the present system. Each of the beams 400,405,410 are shifted by the lens and filter array such that each of the pixel photoreceptors hits a position of maximum photosensitivity of the CMOS image sensor.

To observe or test the performance of relative pixel shift as a function of beam incidence angle, numerous arrays can be fabricated with a single unique relative shift among the lens/filter and pixel center. A single array can also be used with deterministically varying relative shifts among the microlenses and pixels across the array. The array is illuminated at various angles of incidences and the response and crosstalk of the array is recorded. A single array may be fabricated with deterministically varying relative shift among the microlenses and pixel elements. The pixel may then be viewed three-dimensionally, at different angles of incidences. This may be used to test the performance of the trail and error determination.

Figure 5:
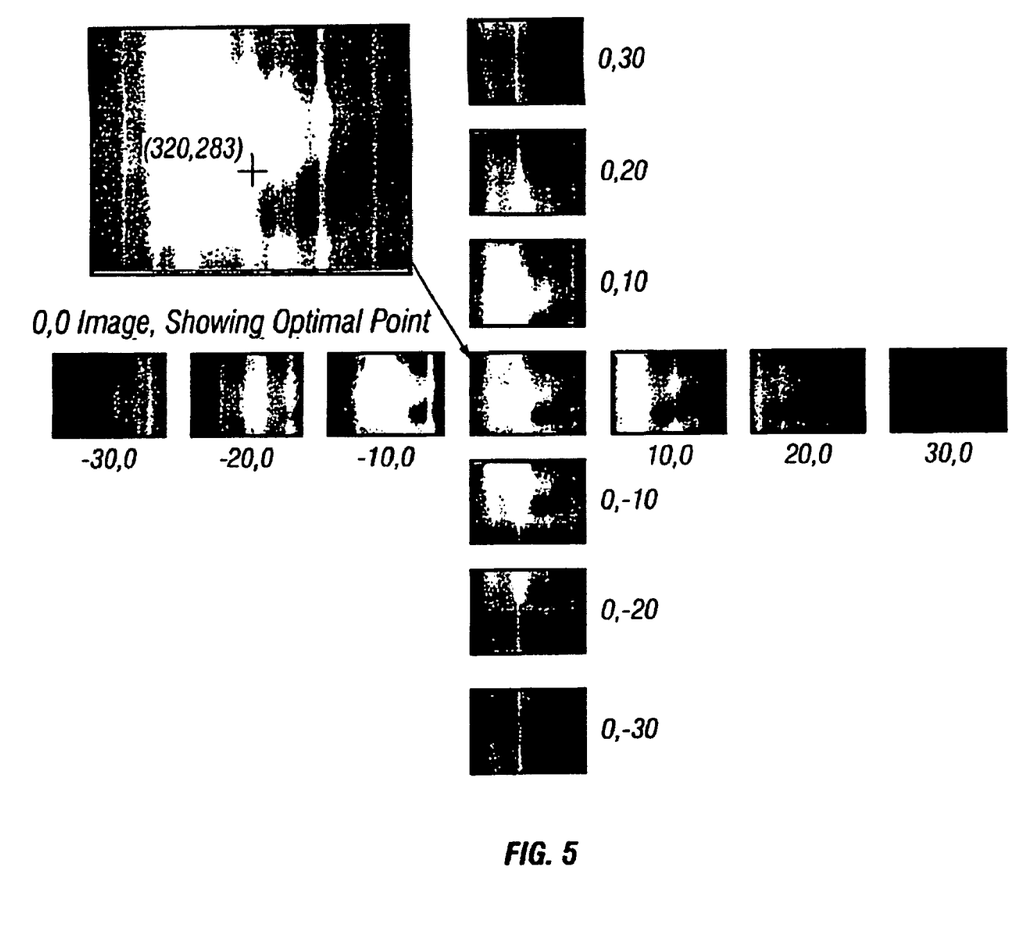
FIG. 5 shows an exemplary light graph for a number of different angles of incidences.

FIG. 5 shows a number of captured images. These images were captured using a CMOS image sensor whose microlenses and filters were offset in the varying amount across the arrays similar to the technique shown in FIG. 4. That is, the microlens/filter is aligned over the center of its respective pixel in the center of the array, then the microlens/filter is gradually shifted off of its respective pixel's center moving toward the edge of the array until at the very edge of the array the microlens/filter was centered over the very edge of its respective pixel. In this manner, illumination of the whole array produced a (whole-array) picture of a single pixel's spatial photosensitivity map for any given angle of incidence and color. Illumination in these images was quasi plane wave white light and incident at angles specified in each of the elements. The center of FIG. 5 shows a pixel's spatial photosensitivity map under an angle of incidence of $\theta_x=0$, $\theta_y=0$. This output may be used to white balance the sensor output for optimal relative shift position. The other parts of the figure show the response of the sensor for different angles of incidence of the illuminating light.

Figure 8:
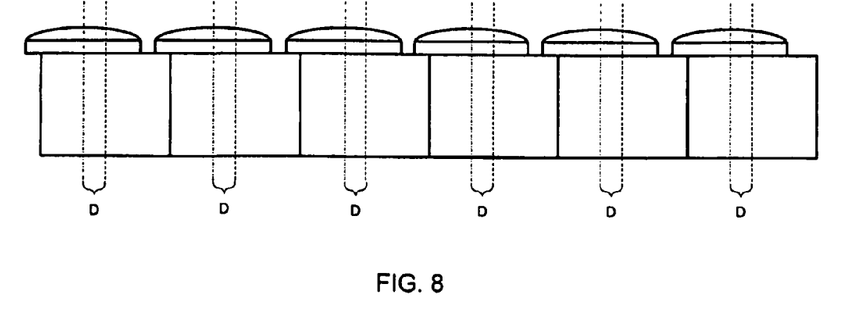
FIG. 8 shows a layout of optical parts of a portion of a pixel array in accordance with an exemplary embodiment of the invention.

FIG. 8 depicts an example of a portion of a pixel array where the pixels have the same amount of intentional offset. That is, the microlens/filters are offset by a distance D from the center of its respective pixel.

Figure 9:
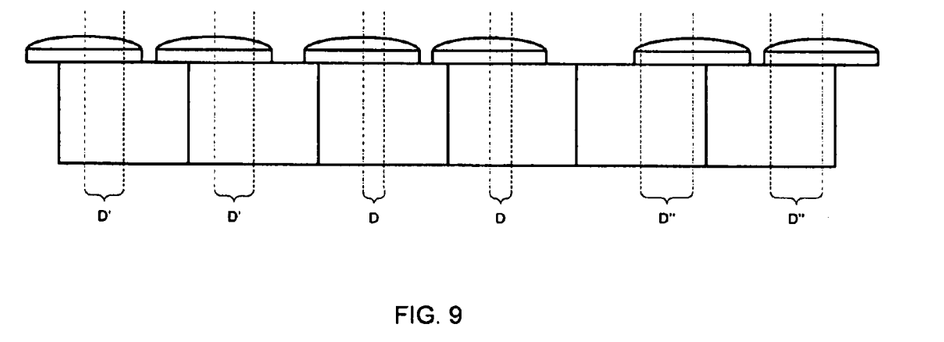
FIG. 9 shows another layout of optical parts of a portion of a pixel array in accordance with an exemplary embodiment of the invention.

FIG. 9 depicts an example of a portion of a pixel array where the pixels have a different amount of intentional offset. That is, the microlens/filters are offset by distances D, D', DD" from the center of its respective pixel.

Figure 6A:
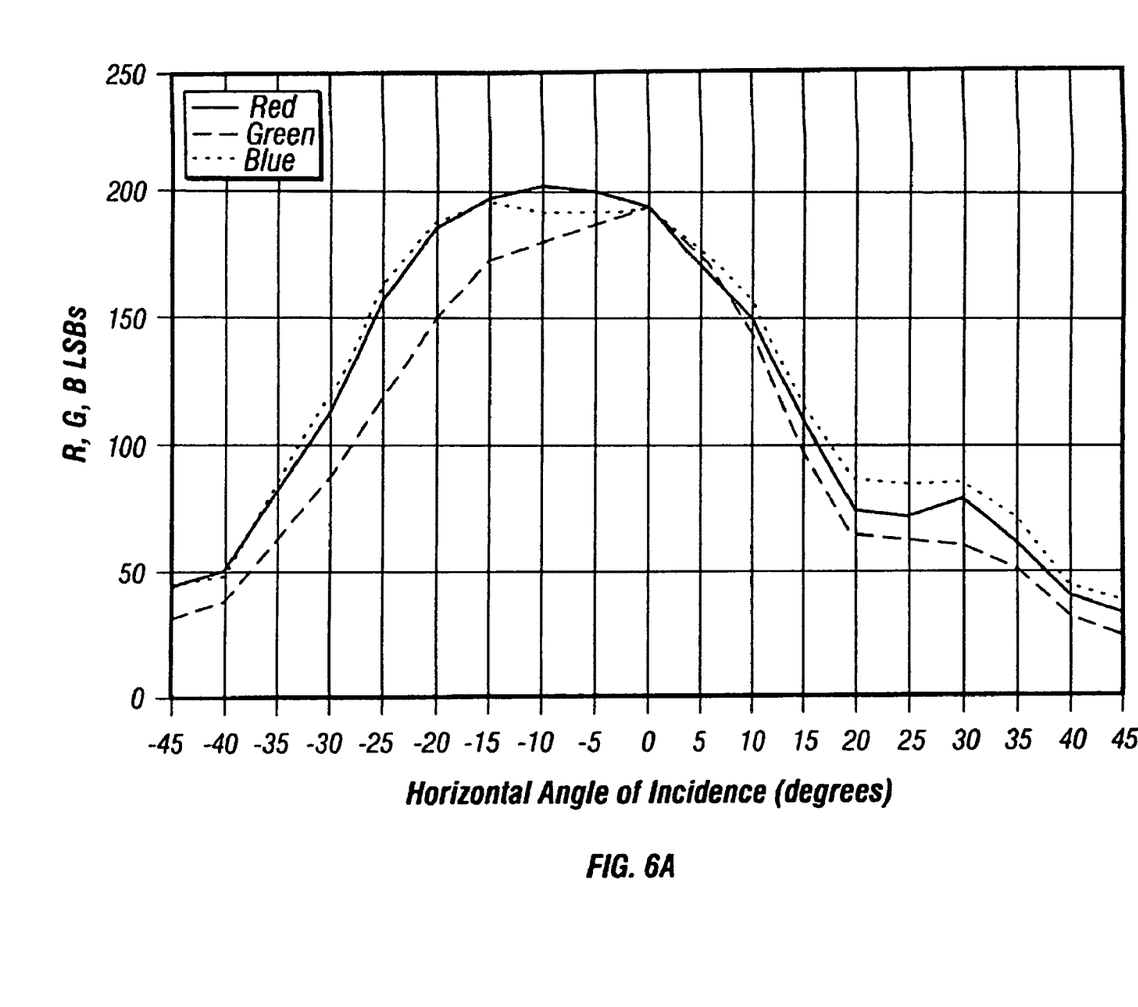
FIGS. 6A and 6B show a graph of output vs. angle of incidence for a number of different angles of incidences.
Figure 6B:
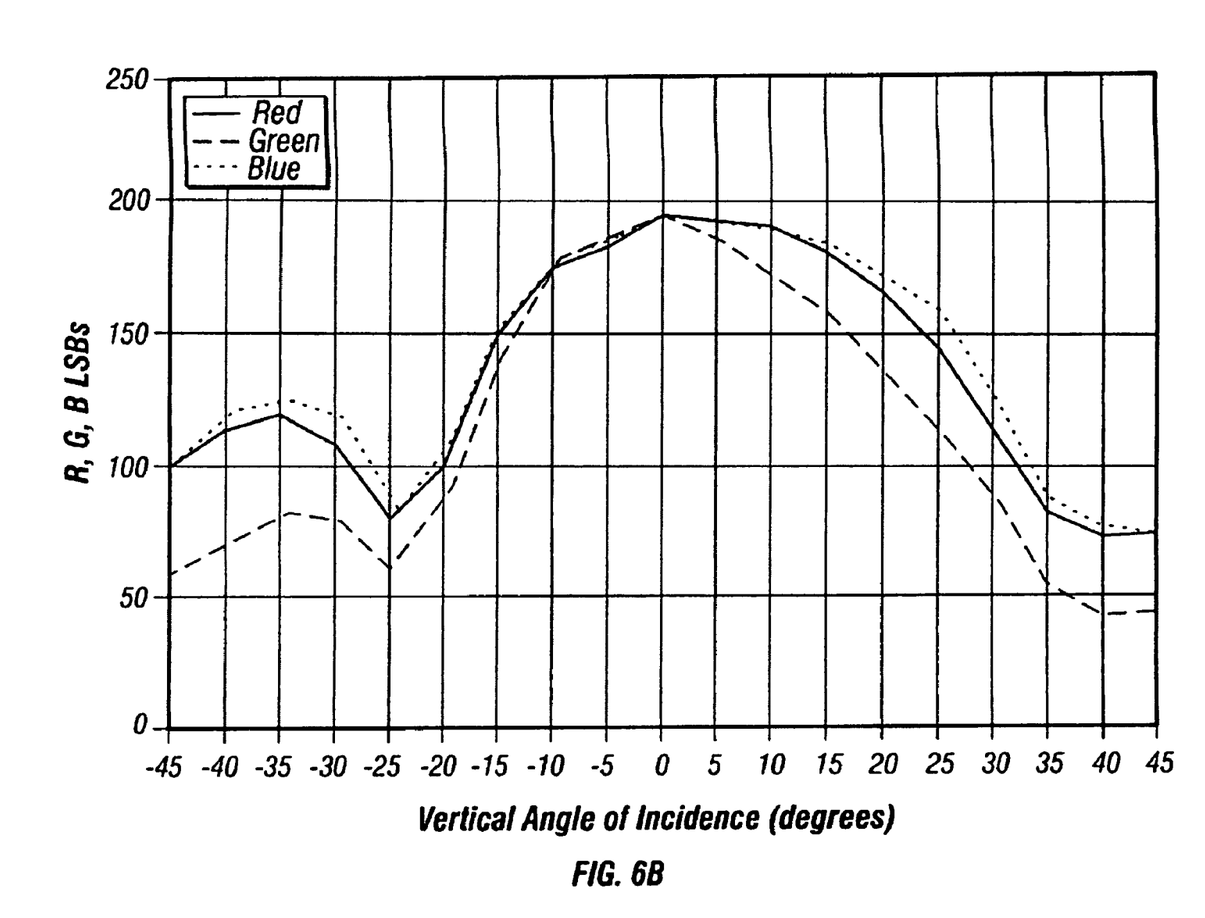

FIG. 6A shows a graph which tracks the RGB values of pixel located at x=320, y=283 ("pixel 320, 283") under various horizontal angles of illumination, while FIG. 6B plots the RGB values of pixel 320, 283 under various vertical angles of illumination. Note that the RGB values under normal incidence have been white balanced for that pixel to a value of 196 (and that 196 is not the maximum value this pixel experiences under various angles of illumination). These plots show how the color and sensitivity vary under various angles of illumination for a given relative shift among the microlens/filter and the physical center of the pixel.

In this experiment, the apparent motion of a given pixel's white balance may be tracked as the illumination angle of incidence is varied. This may be compared to a variable shift among the microlenses and pixels. An optimum variable shift to compensate for given angles of incidence can be deterministically obtained.

For example, the sensor, whose images are shown in FIG. 5 may benefit from a variable shift among the microlens, filters and pixels of 8 nm per pixel, if the imaging lens used with this sensor array suffers from a non-telecentricity of +/−30 degrees at the edges of its image field. This can be seen from the images in FIG. 5 which shows that the apparent motion is one pixel across −30 to +30 degrees. That represents 640 pixels horizontally for which there is a variable microlens shift of 8 nm per pixel. This enables calculating the total microlens shift of 5.12 microns. The corresponding variable shift microlens placement correction factor, for non telecentric imaging should therefore be 0.085 microns per degree.

Thus, for any image, there exists an additional one degree of non telecentricity. The relative shift among the microlens centers and pixel centers should hence be reduced towards the center of the array by 85 nm.

For example, if the 85 mm per degree variable shift is substituted into equation 1, that is S=85 nm when $\theta$ equals one degree, and we assume a relative dielectric refractive index n=1.5, then the depth (i.e., D) from the plane of the microlens to the plane of the specified feature comes out D=7.3 microns. This result is very close to the value from the plane of the microlens layer to the plane of the metal one (M1) layer in the array under examination as estimated from the fabrication design rules (7.2 microns+/−0.2 microns).

The microlenses according to this system may be spherical, cylindrical, or reflowed square footprint lenses. Use of microlenses with deterministic prismatic properties may be employed if non-telecentric imaging optics are used.

An aspect of this system includes minimizing the crosstalk from the resulting received information. Crosstalk in the image sensor may degrade the spatial resolution, reduce overall sensitivity, reduce color separation, and lead to additional noise in the image after color correction. Crosstalk in CMOS image sensors may generally be grouped as spectral crosstalk, spatial optical crosstalk, and electrical crosstalk.

Spectral crosstalk occurs when the color filters are imperfect. This may pass some amount of unwanted light of other colors through the specific filter.

Spatial optical crosstalk occurs because the color filters are located a finite distance from the pixel surface. Light which impinges at angles other than orthogonal may pass through the filter. This light may be partially absorbed by the adjacent pixel rather than the pixel directly below the filter. The lens' optical characteristics, e.g. its F number or telecentricity, may cause the portion of the light absorbed by the neighboring pixel to vary significantly. Microlenses located atop the color filters may reduce this complement of crosstalk.

Electrical crosstalk results from the photocarriers which are generated from the image sensor moving to neighboring charge accumulation sites. Electrical crosstalk occurs in all image sensors including monochrome image sensor. The quantity of crosstalk in carriers depends on the pixel structure, collection areas size and intensity distribution.

Each of these kinds of cross can be graphed, and the optimum shift for the crosstalk reduction can be selected. For example, each of the spectral crosstalk, optical crosstalk and electrical crosstalk can be separately viewed. The different types of crosstalk can then be separately optimized.

Figure 7:
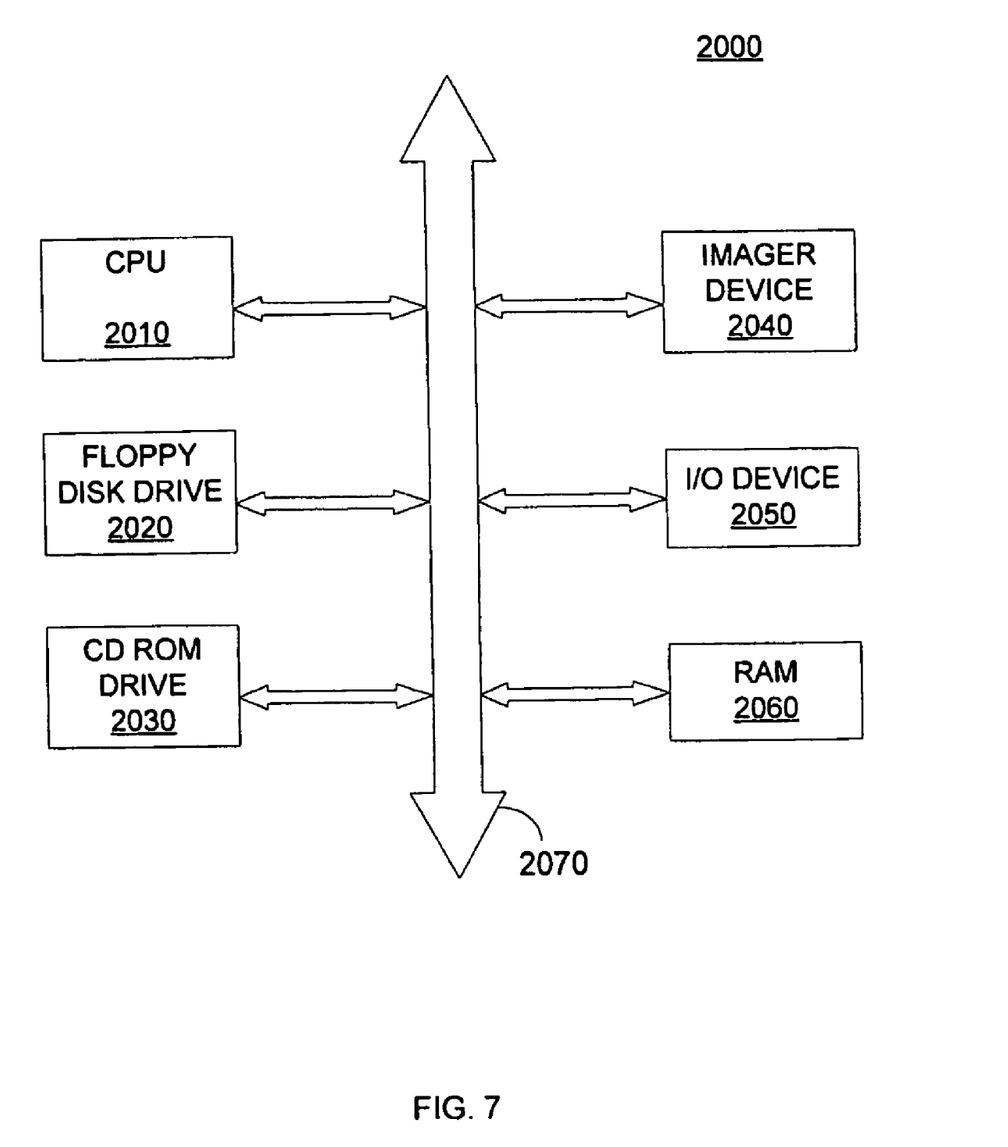
FIG. 7 is a block diagram of a processor based system incorporating the image sensor of FIG. 4 in accordance with an exemplary embodiment of the invention.

FIG. 7 shows system 2000, a typical processor based system modified to include an image sensor as depicted in FIG. 4 as part of an imager device 2040. Processor based systems exemplify systems of digital circuits that could include an image sensor. Examples of processor based systems include, without limitation, computer systems, camera systems, scanners, machine vision systems, vehicle navigation systems, video telephones, surveillance systems, auto focus systems, star tracker systems, motion detection systems, image stabilization systems, and data compression systems for high-definition television, any of which could utilize the invention.

System 2000 includes central processing unit (CPU) 2010 that communicates with various devices over bus 2070. Some of the devices connected to bus 2070 provide communication into and out of system 2000, illustratively including input/output (I/O) device 2050 and imager device 2040. Other devices connected to bus 2070 provide memory, illustratively including random access memory (RAM) 2060, and one or more peripheral memory devices such as floppy disk drive 2020 and compact disk (CD) drive 2030.

Other embodiments are within the disclosed invention. While the invention has been described in detail in connection with preferred embodiments known at the time, it should be readily understood that the invention is not limited to the disclosed embodiments. Rather, the invention can be modified to incorporate any number of variations, alterations, substitutions or equivalent arrangements not heretofore described, but which are commensurate with the spirit and scope of the invention. For example, the offset may be calculated without the refractive index n. Accordingly, the invention is not limited by the foregoing description or drawings, but is only limited by the scope of the appended claims.

What is claimed as new and desired to be protect by Letter Patent of the United States is:

1. An imager array, comprising:
   photoreceptors and passive elements for directing light to said photoreceptors, where the alignment and position of the photoreceptors and passive elements are determined based on the results of:
   using a model of an array of photoreceptors and an array of associated passive elements, an amount of an intentional shift between said passive elements of the array and areas of maximum sensitivity of the respective photoreceptors, such that incoming light to each of said photoreceptors is directed by said passive elements to said areas of maximum sensitivity of the photoreceptors, wherein said act of using a model includes modeling a photoreceptor and associated passive element of said imager array according to:

$$S = D\tan\left\{\sin^{-1}\left[\frac{\sin(\theta)}{n}\right]\right\}$$
$$= D\tan\left\{\sin^{-1}\left[\frac{\sin\left(\frac{Mr}{R}\right)}{n}\right]\right\}$$

where $\theta$ represents an external beam entry angle, and n is a refractive index of a medium between a microlens and a photosensitive part of the photoreceptor, M is a maximum beam angle of non-telecentricity, D is a physical distance between a plane of the microlens and a plane of the photoreceptor's area of maximum photosensitivity, R is a maximum image point radius, and r is a image point radius under consideration for calculating S,
   analyzing crosstalk which includes separately analyzing spectral crosstalk, optical crosstalk, and electrical crosstalk, and
   forming an array of photoreceptors in an array of pixels and an array of associated passive elements having an intentional shift using results from said acts of determining and analyzing.

2. The array as in claim 1, wherein said separately analyzing comprises graphing the different types of crosstalk.

3. An imager array, comprising:
   pixels and passive elements for directing light to said pixels, where the alignment and position of the pixels and passive elements are determined based on the results of:
   examining different images obtained at different illumination angles;
   determining an apparent motion in said different images across a photoreceptor array in an array of pixels;
   determining from the apparent motion a desired shift, between passive elements of an array and areas of maximum sensitivity of associated photoreceptors in an array of pixels, where said passive elements are adapted such that incoming light to each of said pixels is directed by passive elements to said areas of maximum sensitivity of the photoreceptor of each of said pixel; and
   where said array of pixels and said array of associated passive elements have an intentional shift using results of said acts of examining different images, determining said apparent motion, and determining said desired shift.

4. An imager array, comprising:
   photoreceptors and passive elements for directing light to said photoreceptors, where the alignment and position of the photoreceptors and passive elements are determined based on the results of:

analyzing crosstalk in a pixel array, wherein said analyzing crosstalk comprises analyzing separately spectral crosstalk, optical crosstalk, and electrical crosstalk; and using a result of said analyzing to determine an amount of shift among passive elements of the photoreceptor array and areas of peak photosensitivity of photoreceptive elements of the photoreceptors array, where said shift includes directing incoming light to an area of peak photosensitivity of said photoreceptive elements.

5. An array as in claim 4, wherein said analyzing crosstalk comprises graphing at least of one of said crosstalks.

* * * * *